United States Patent
Jang et al.

(10) Patent No.: US 6,833,619 B1
(45) Date of Patent: Dec. 21, 2004

(54) THIN PROFILE SEMICONDUCTOR PACKAGE WHICH REDUCES WARPAGE AND DAMAGE DURING LASER MARKINGS

(75) Inventors: Sang Jae Jang, Seoul (KR); Sun Goo Lee, Seoul (KR); Sung Su Park, Seoul (KR); Sung Soon Park, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/425,134

(22) Filed: Apr. 28, 2003

(51) Int. Cl.[7] .......................... H01L 23/34; H01L 23/02; H01L 23/06; H01L 23/04; H01L 23/28; H01L 23/29

(52) U.S. Cl. .................. 257/728; 257/678; 257/680; 257/684; 257/698; 257/778; 257/788

(58) Field of Search ................ 257/788, 680, 257/678, 778, 728, 701, 690, 698, 684

(56) References Cited

U.S. PATENT DOCUMENTS

| | | | | |
|---|---|---|---|---|
| 615,356 | A | * 12/1898 | Hawkes | ...................... 126/412 |
| 5,583,378 | A | * 12/1996 | Marrs et al. | ................. 257/710 |
| 5,696,666 | A | 12/1997 | Miles et al. | |
| 6,013,948 | A | 1/2000 | Akram et al. | |
| 6,020,629 | A | 2/2000 | Farnworth et al. | |
| 6,060,778 | A | * 5/2000 | Jeong et al. | ................. 257/710 |
| 6,101,100 | A | 8/2000 | Londa | |
| 6,323,065 | B1 | * 11/2001 | Karnezos | .................... 438/122 |
| 6,399,418 | B1 | 6/2002 | Glenn et al. | |
| 6,515,356 | B1 | 2/2003 | Shin et al. | |
| 6,537,848 | B2 | * 3/2003 | Camenforte et al. | ......... 438/106 |
| 6,636,334 | B2 | * 10/2003 | Nakamura | ................... 358/434 |
| 6,664,616 | B2 | * 12/2003 | Tsubosaki et al. | .......... 257/668 |
| 6,686,609 | B1 | * 2/2004 | Sung | .......................... 257/100 |
| 6,706,564 | B2 | * 3/2004 | Kim et al. | .................... 438/125 |
| 2002/0079570 | A1 | * 6/2002 | Ho et al. | ..................... 257/697 |
| 2002/0140085 | A1 | * 10/2002 | Lee et al. | .................... 257/724 |
| 2003/0025199 | A1 | * 2/2003 | Wu et al. | .................... 257/724 |

* cited by examiner

*Primary Examiner*—Nathan J Flynn
*Assistant Examiner*—Victor A. Mandala, Jr.
(74) *Attorney, Agent, or Firm*—Weiss, Moy & Harris, P.C.

(57) ABSTRACT

A semiconductor package has a substrate comprising a resin layer of an approximate planar plate, a cavity passing through the resin layer vertically at a center area thereof, a plurality of electrically conductive patterns formed at a bottom surface of the resin layer, and a conductive plan. An adhesive layer of a predetermined thickness is formed at an upper part of an inside of the cavity. A semiconductor die is positioned inside the cavity of the substrate and has a plurality of bond pads formed at a bottom surface thereof, a bottom surface of the adhesive layer being bonded to a top surface thereof. A plurality of conductive wires for electrically connecting the bond pads of the semiconductor die to the electrically conductive patterns are formed at a bottom surface of the substrate. An encapsulant is used for covering the semiconductor die formed at the lower part of the adhesive layer, the conductive wires and the cavity. A plurality of solder balls are fused to the electrically conductive patterns, which is formed at the bottom surface of the substrate.

20 Claims, 7 Drawing Sheets

THIN PROFILE SEMICONDUCTOR PACKAGE WHICH REDUCES WARPAGE AND DAMAGE DURING LASER MARKINGS

BACKGROUND OF THE INVENTION

1. Field of the Invention

This invention relates to a semiconductor package, and, more specifically, to a thin profile semiconductor package and a method of manufacturing the same.

2. Description of the Related Art

In general, a conventional semiconductor package includes a substrate having a cavity of a predetermined size at the center thereof, a semiconductor die positioned in the cavity of the substrate, a plurality of conductive wires for electrically connecting the semiconductor die to the substrate, an encapsulant for covering the semiconductor die and the cavity, and a plurality of solder balls fused to one surface of the substrate.

Many semiconductor packages have a high performance and a small surface mounting area with little thickness. Recently, these semiconductor packages have been widely used for miniaturized and multi-functional electronic appliances.

Because the back side of the semiconductor die of the conventional semiconductor package may be exposed to the outside, a laser marking process occurs after the back side is masked with an adhesive. The reason that it requires the masking process, as described above, is because the energy of the laser is directly transmitted to the semiconductor die, thereby damaging the semiconductor die, when the laser marking process occurs at the back side of the bare die.

Also, since the cavity is formed at the center of the substrate in the conventional semiconductor package, a warpage phenomenon may occur during mold process. In case the warpage of the semiconductor package is severe, an additional process is required such as vacuum suction process in order to print the masking layer for the marking process on the semiconductor die and substrate uniformly. At this time, a die crack or a package crack can be induced by the forced suction, where the severe warpage is generated in the semiconductor package.

Furthermore, in the conventional semiconductor package, a wire bonding process is performed after the semiconductor die is bonded to a cover lay tape. At this time, the cover lay tape should be stabilized at a high wire bonding temperature of about 130° C., without being transformed. However, the cost of the cover lay tape is very high, in spite of consumption goods, giving rise to an increase in the cost of the semiconductor package.

Also, in the conventional semiconductor package, a mold flash is permeated into the interface between the substrate and the cover lay tape, in which the bonding force between them is weak, thereby contaminating the substrate or ball lands, resulting in a poor semiconductor package.

Moreover, in the conventional semiconductor package, as the cover lay tape is thrown into the mold, even during the molding process, a problem occurs in that a residue of the cover lay tape remains on the surface of the substrate owing to a high temperature as well as clamping pressure.

Therefore a need existed to provide a semiconductor package and a method of producing a semiconductor package that overcomes the above problems.

A BRIEF SUMMARY OF THE INVENTION

A semiconductor package has a substrate comprising a resin layer of an approximate planar plate, a cavity passing through the resin layer vertically at a center area thereof, a plurality of electrically conductive patterns formed at a bottom surface of the resin layer, and a conductive plan. An adhesive layer of a predetermined thickness is formed at an upper part of an inside of the cavity. A semiconductor die is positioned inside the cavity of the substrate and has a plurality of bond pads formed at a bottom surface thereof, a bottom surface of the adhesive layer being bonded to a top surface thereof. A plurality of conductive wires for electrically connecting the bond pads of the semiconductor die to the electrically conductive patterns are formed at a bottom surface of the substrate. An encapsulant is used for covering the semiconductor die formed at the lower part of the adhesive layer, the conductive wires and the cavity. A plurality of solder balls are fused to the electrically conductive patterns, which is formed at the bottom surface of the substrate.

The present invention is best understood by reference to the following detailed description when read in conjunction with the accompanied drawings.

BRIEF DESCRIPTION OF THE DRAWINGS

Common reference numerals are used throughout the drawings as well, detailed descriptions are used to indicate like elements.

DETAILED DESCRIPTION OF THE INVENTION

Figure 1:
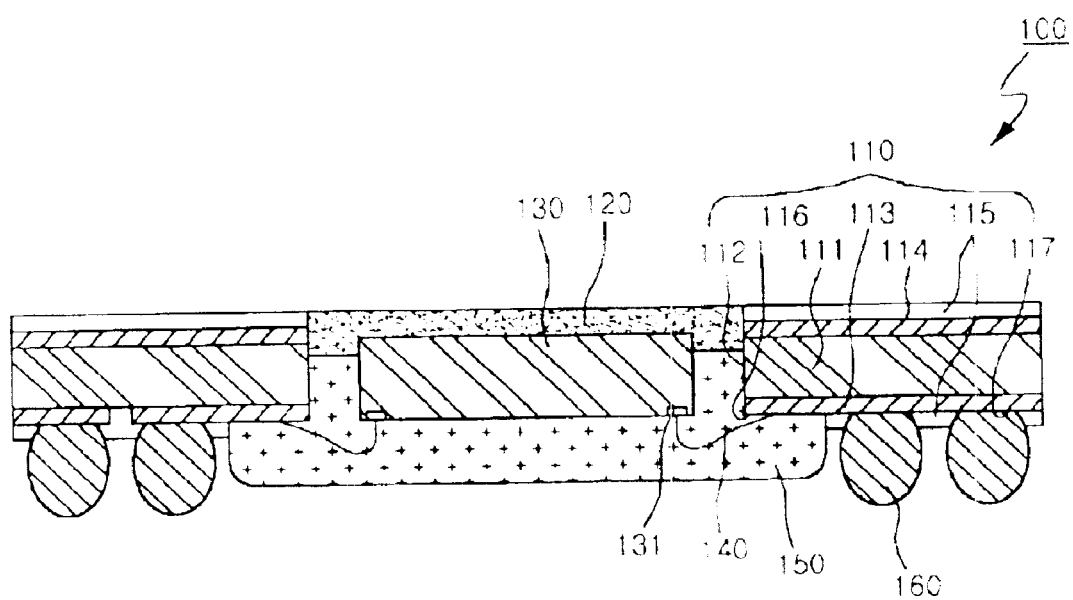
FIG. 1 is a sectional view of a semiconductor package according to one embodiment of the present invention.

Referring to FIG. 1, a sectional view of a semiconductor package 100 according to one embodiment of the present invention is illustrated.

As shown in the drawing, the semiconductor package 100 includes a substrate 110 having a cavity 112 of a predetermined size at the center thereof, an adhesive layer 120 formed at the upper part of the inside of the cavity 112, a semiconductor die 130 bonded to the lower part of the adhesive layer 120 at the inside of the cavity 112, a plurality of conductive wires 140 for electrically connecting the semiconductor die 130 to the substrate 110, an encapsulant 150 for covering the semiconductor die 130 formed at the inside of the cavity 112 and the conductive wires 140 and a plurality of solder balls 160 fused to the bottom surface of the substrate 110.

The substrate 110 includes a thermosetting resin layer 111 of an approximate planar plate and the cavity 112 of a predetermined width passing through the resin layer 111 vertically at a center area thereof. It is preferred that the width of the cavity 112 is larger than that of the semiconductor die 130. Also, the substrate 110 further comprises a plurality of electrically conductive patterns 113 for transmitting signals formed at the bottom surface of the resin layer 111, which is located at the periphery of the cavity 112, in addition to a conductive plan 114 used for shielding it from electromagnetic waves formed at the entire top surface of the resin layer 111, which is located at the periphery of the cavity 112. Here, the electrically conductive patterns 113 and the conductive plan 114 may be conventional copper (Cu) or its equivalent. Also, an insulating protective layer 115 can be coated on the surface of the conductive plan 114 in order that it protects the substrate 110 from an external environment. Moreover, the insulating protective layer 115 can be coated on the entire surface of the electrically conductive patterns 113 except for the wire bonding regions 116 and the solder bonding regions 117, used in order to protect the substrate 110 from an external environment.

The top surface of the adhesive layer 120 is flushed with the top surface of the substrate 110, as well the adhesive layer 120 of a predetermined thickness which is formed at the inside of the cavity 112 of the substrate 110. All kinds of figures, pictures and marks (not shown) etc. can be marked by a laser. The adhesive layer 120 may be a conventional epoxy or its equivalent. Also, the adhesive layer 120 may be thermally conductive. In case of using the thermally conductive adhesive, thermal characteristics of the semiconductor package is improved. However, the present invention is not limited to any material of the adhesive layer. It is preferable that, the adhesive layer has a predetermined thickness such that the circuit regions of the semiconductor die are not destroyed during the laser marking process. For example, the thickness of the adhesive layer 120 may be similar to or thicker than the combined thickness of the conductive plan 114 and the protective layer 115.

The semiconductor die 130 is located at the inside of the cavity 112 of the substrate 110. The top surface of the semiconductor die 130 is bonded to the bottom surface of the adhesive layer 120. Here, a plurality of bond pads 131 for input and output terminals is located at the bottom surface of the semiconductor die 130. Also, It is preferable that the width of the semiconductor die 130 is slightly smaller than that of the cavity 112, in order that the semiconductor die 130 is easily positioned in the cavity 112. It is preferred that the thickness of the semiconductor die 130 is slightly smaller than that of the substrate 110, so as to make the semiconductor package 100 thin.

Bond pads 131 of the semiconductor die 130 and the electrically conductive patterns 113 are formed at the bottom surface of the substrate 110. The wire bonding regions 116 are electrically connected to each other by the plurality of conductive wires 140. The conductive wire 140 may be a conventional gold (Au), aluminum (Al) or its equivalent. However, the present invention is not limited to any material of the conductive wire.

The semiconductor die 130 located at the lower part of the adhesive layer 120, the conductive wires 140 and the cavity 112 are encapsulated by the encapsulant 150. The encapsulant 150 may be a conventional epoxy molding compound, a liquid encapsulant or its equivalent However, the present invention is not limited to any material of the encapsulant. Since the semiconductor die 130 is covered by the encapsulant 150 and the adhesive layer 120, mechanical locking of the semiconductor die 130 is improved.

Finally, the plurality of solder balls 160 is fused to the electrically conductive patterns 113, that is, the solder ball bonding regions 117, which is opened through the protective layer 115. The solder balls 160 are reflowed in the future so that the semiconductor package 100 is fixed to an external device where the signals of the semiconductor package 100 are transmitted to the external device.

Figure 2:
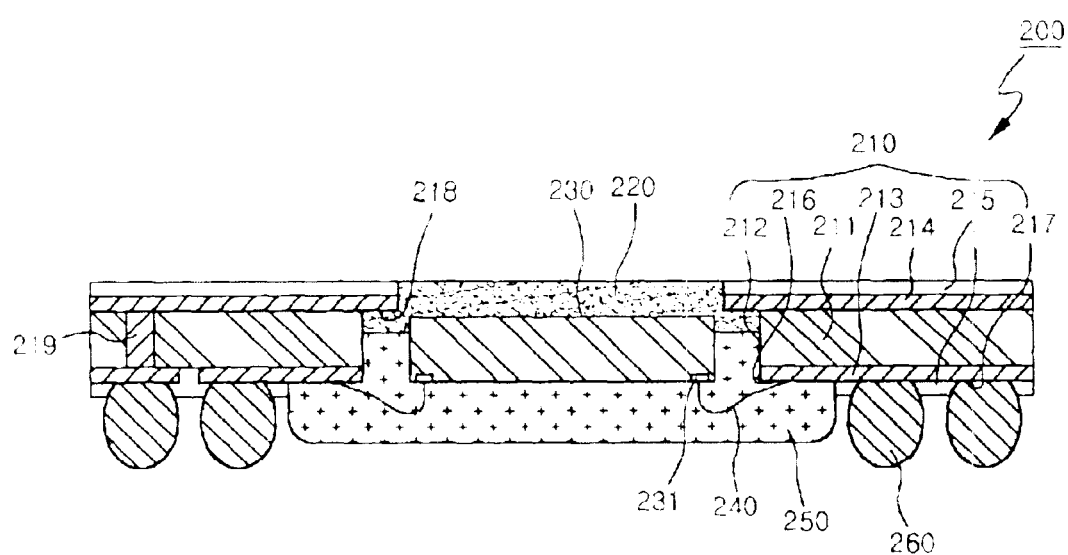
FIG. 2 is a sectional view of a semiconductor package according to another embodiment of the present invention.

Referring to FIG. 2, a sectional view of a semiconductor package 200 according to another embodiment of the present invention is illustrated. Since the semiconductor package 200 as shown in FIG. 2 is similar to the semiconductor package 100 of FIG. 1, it will be described around these differences as stated below.

As shown in the drawing, a conductive plan 214 for shielding from electromagnetic waves formed at the top surface of a substrate 210 is further extended to the inside of a cavity 212 at a predetermined length. That is, an extended part 218 of a predetermined length extended from the conductive plan 214 is further formed at the inside of the cavity 212. Of course, a protective layer 215 is coated on the entire top surface of the conductive plan 214 including the extended part 218. Also, the conductive plan 214 can be electrically connected to a specific conductive pattern 213 through a conductive via 219 that passes through a resin layer 211. Accordingly, the conductive plan 214 including the extended part 218 can be positively shielded from the external electromagnetic waves. Also, the conductive plan 214 can be used for grounding.

Figure 3:
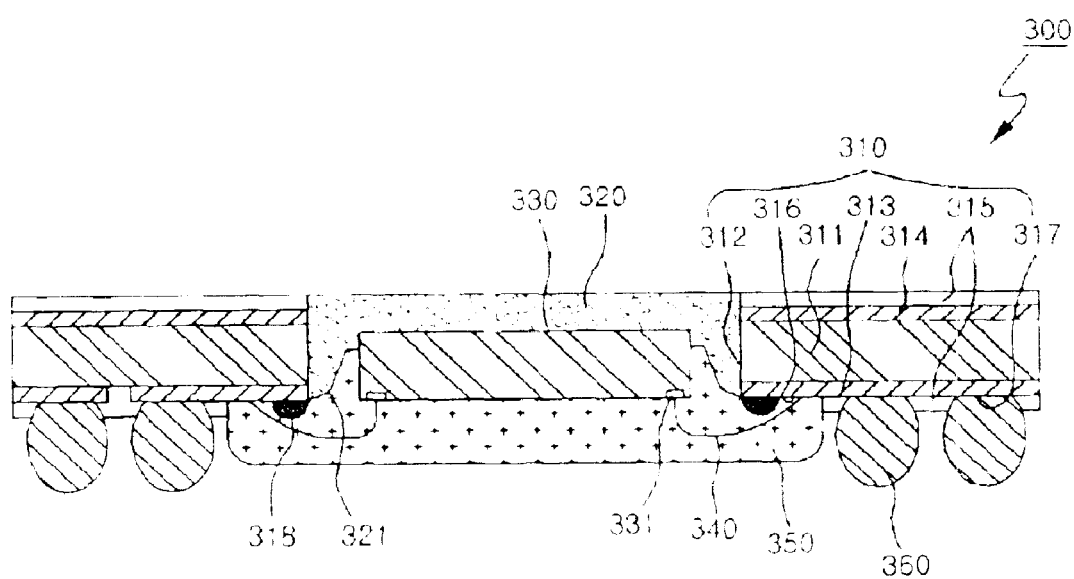
FIG. 3 is a sectional view of a semiconductor package according to further another embodiment of the present invention.

Referring to FIG. 3, a sectional view of a semiconductor package 300 according to another further embodiment of the present invention is illustrated. Since the semiconductor package 300 as shown in FIG. 3 is similar to the semiconductor package 100 of FIG. 1, it will be described around those differences as is stated below.

As shown in the drawing, an insulating dam 318 of a predetermined thickness is further formed at the bottom surface of a substrate 310, which is located at the periphery of a cavity 312 of the substrate 310. The insulating dam 318 serves to prevent the electrically conductive patterns 313 from contamination, owing to an adhesive layer 320. That is, the insulating dam 318 serves to prevent the future possibility, in that a part 321 of the adhesive layer 320 overflows and penetrates into the wire bonding regions 316. It is preferred that the thickness of the insulating dam 318 be sufficiently smaller than the loop height of a conductive wire 340, in order that the dam 318 does not make contact with the conductive wire 340.

Referring to FIGS. 4A through 4G sectional views illustrating method for manufacturing a semiconductor package according to one embodiment of the present invention.

Figure 4A:
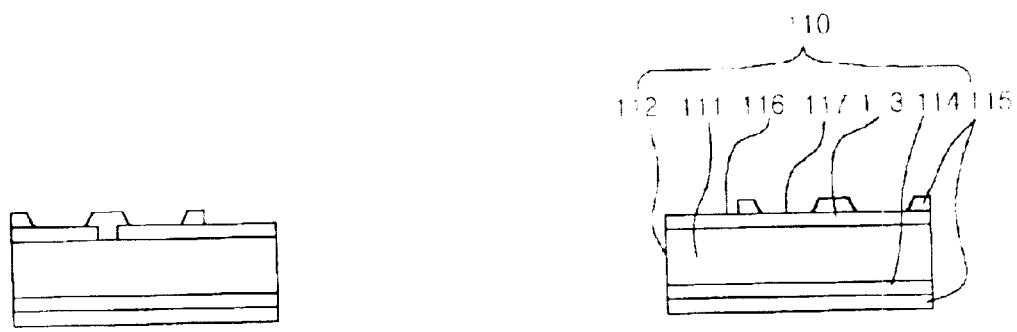
FIGS. 4A through 4G are sectional views illustrating method for manufacturing a semiconductor package according to one embodiment of the present invention.

As shown in FIG. 4A, a substrate 110 providing step is illustrated. The substrate 110 includes the thermosetting resin layer 111 of an approximate planar plate, the cavity 112 of a predetermined width passing through the resin layer 111, vertically at a center area thereof, the plurality of electrically conductive patterns 113 for transmitting signals formed at the bottom surface of the resin layer 111, which is located at the periphery of the cavity 112 and the conductive plan 114 for shielding from a electromagnetic waves formed at the entire top surface of the resin layer 111, which is located at the periphery of the cavity 112.

Here, though it is not shown in the figure, the conductive plan 114 further can comprise an extended part that is further extended to the inside of the cavity 112 at a predetermined length. Also, the conductive plan 114 can be electrically connected to a specific conductive pattern 113 via a conductive via. More over, an insulating dam of a predetermined thickness can be further formed at the bottom surface of the substrate 110, which is located at the periphery of a cavity 112 of the substrate 110.

Figure 4B:
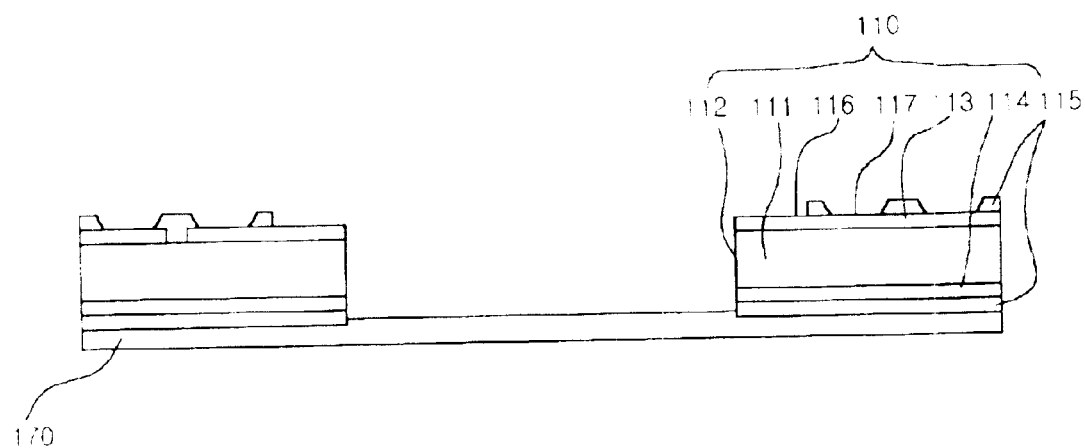

As shown in FIG. 4B, a cover lay tape 170 bonding step is illustrated. The cover lay tape 170 is bonded to the entire bottom surface of the substrate 110. Accordingly, the cover lay tape 170 closes up the lower part of the cavity 112 of the substrate 110. Here, an endured high wire bonding temperature is not necessary. Suppose that the semiconductor die 130 is not simply separated from the cover lay tape 170, the cover lay tape 170 of a lower price may be used.

Figure 4C:
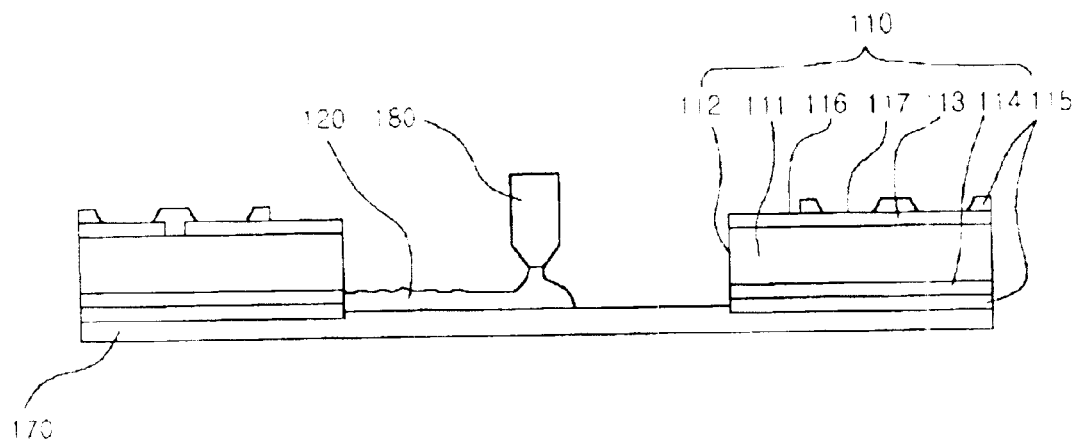
Figure 4D:
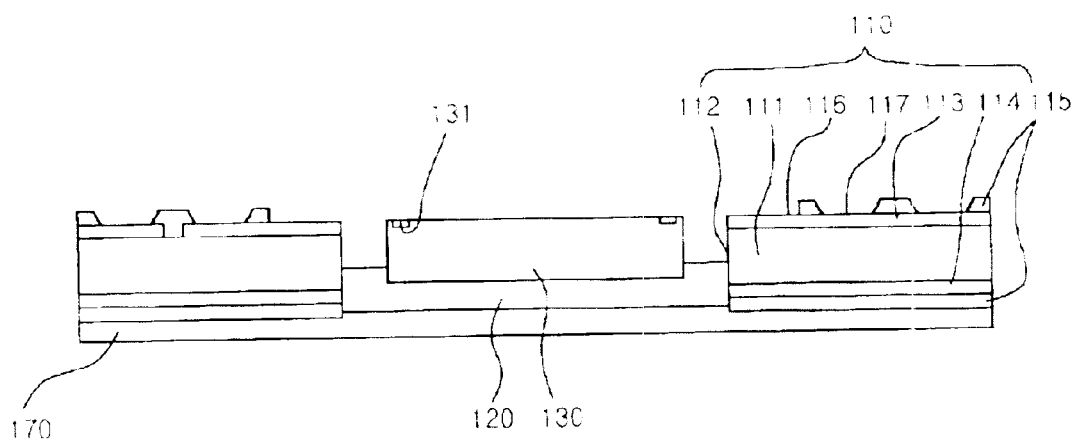

As shown in FIG. 4C, an adhesive layer 120 forming step is illustrated. The adhesive layer 120 of a predetermined thickness is formed at the top surface of the cover lay tape 170, which closes up the cavity. The adhesive layer 120 can be formed by applying an epoxy or its equivalent by means of a dispenser 180.

As shown in. 4D, a semiconductor die 130 attaching step and a cover lay tape 170 eliminating step are illustrated. The semiconductor die 130 is bonded to the adhesive layer 120 at the bottom surface thereof and a plurality of bond pads 131 is formed at the top surface of the semiconductor die 130. Here, a curing process of high temperature occurs after the bonding of the semiconductor die 130, so that the semiconductor die 130 is completely bonded to the adhesive layer 120 and the adhesive layer 120 is hardened. Thereafter, the cover lay tape 170 bonded to the bottom surface of the substrate 110 is separated and eliminated. At this time, the bottom surface of the adhesive layer 120 is exposed to the outside through the cavity 112 of the substrate 110. Also, the bottom surface of the adhesive layer 120 is flushed with the bottom surface of the substrate 110.

Figure 4E:
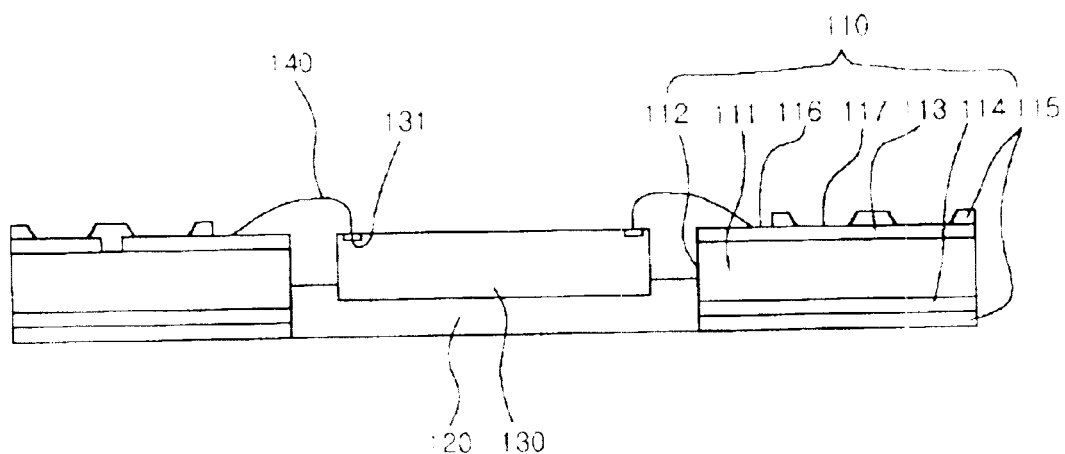

As shown in FIG. 4E, a wire bonding step is illustrated. The bond pads 131 of the semiconductor die 130 and the electrically conductive patterns 113 formed at the bottom surface of the substrate 110 are electrically connected to each other by the plurality of conductive wires 140. The conductive a wire 140 may be of conventional gold (Au), aluminum (Al) or its equivalent. However, the present invention is not limited to any material of the conductive wire.

Figure 4F:
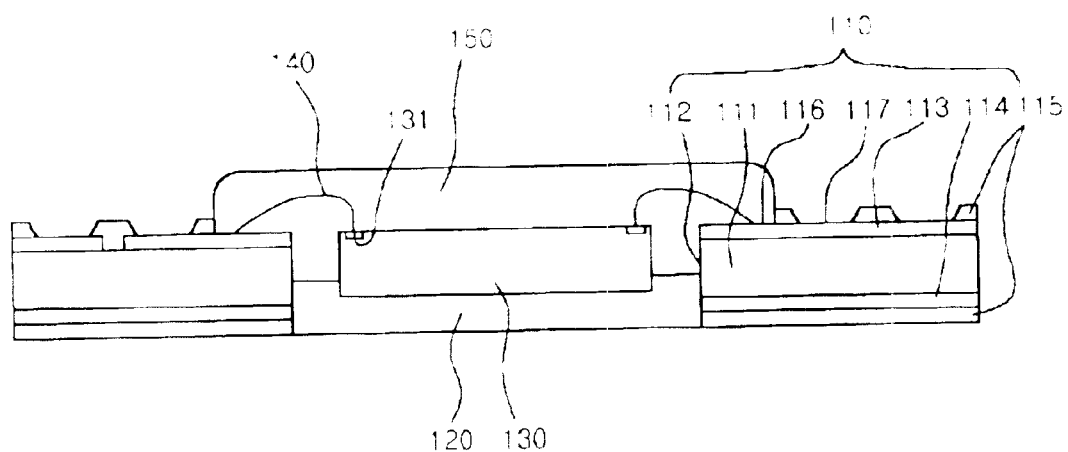
Figure 4G:
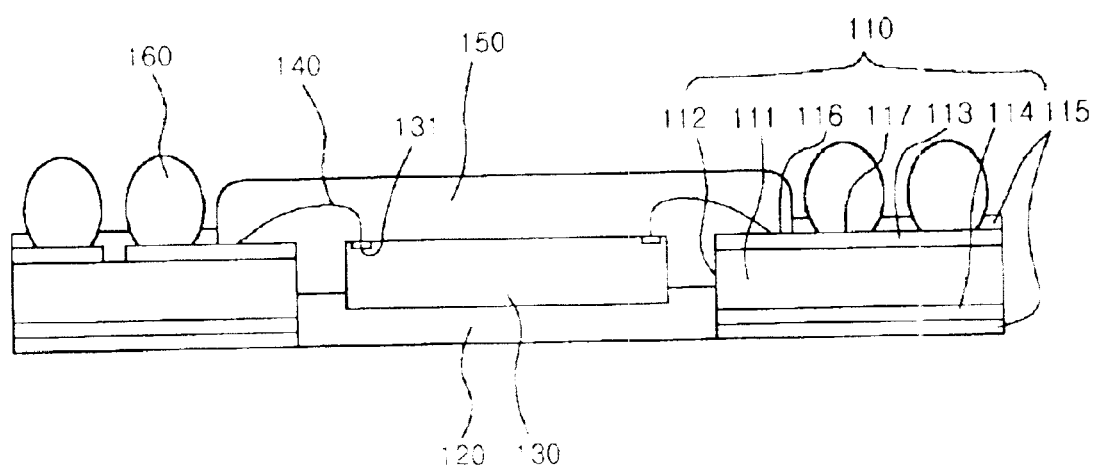

As shown in FIG. 4F, an encapsulant 150 forming step is illustrated. The semiconductor die 130, the conductive wires 140 and the cavity 112 are encapsulated by the encapsulant 150. The encapsulant 150 may be a conventional epoxy molding compound, a liquid encapsulant or its equivalent. However, the present invention is not limited to any material of the encapsulant.

As shown in 4G, a solder ball 160 fusing step is illustrated. The plurality of solder balls 160 is fused to a plurality of electrically conductive patterns 113, which is formed at the top surface of the substrate 110. Such solder balls 160 are temporarily located on each electrically conductive pattern 113 by means of a sticky material, such as a flux. Thereafter, the solder balls 160 are completely fixed to the electrically conductive patterns 113 through a reflow process of a high temperature.

Also, though it is not shown in the figure, the manufacturing processes of the semiconductor package can further include a laser marking process in which figures, pictures and marks etc. are marked on the exposed surface of the adhesive layer 120 by means of a laser. Here, since the thickness of the adhesive layer 120 is comparatively thicker, the energy of the laser cannot be directly transmitted to the circuit regions of the semiconductor die 130. Accordingly, the circuit regions of the semiconductor die 130 are not destroyed or damaged during the laser marking process.

Also, according to present invention, masking layer is not required because the laser is marked on the adhesive layer 120 instead of the masking layer. In other word, the vacuum suction process is not required as well. Thus, the masking layer forming step and vacuum suction step may be eliminated. Accordingly, a die crack or a package crack does not occurred.

This disclosure provides exemplary embodiments of the present invention. The scope of the present invention is not limited by these exemplary embodiments. Numerous variations, whether explicitly provided for or implied by the specification, such as variations in structure, dimension and type of material and the manufacturing process may be implemented by one who is skilled in the art, in view of this disclosure.

What is claimed is:

1. A semiconductor package comprising:
    a substrate comprising a resin layer of an approximate planar plate, a cavity passing through the resin layer vertically at a center area thereof, a plurality of electrically conductive patterns formed at a bottom surface of the resin layer, and a conductive plan;
    an adhesive layer formed at an upper part of an inside of the cavity and having an exposed top surface;
    a semiconductor die positioned inside the cavity of the substrate and having a plurality of bond pads, a bottom surface of the adhesive layer being bonded to the semiconductor die;
    a plurality of conductive wires for electrically connecting the bond pads to the electrically conductive patterns; and
    an encapsulant for covering the semiconductor die formed at the lower part of the adhesive layer, the conductive wires and the cavity.

2. The semiconductor package of claim 1, wherein the conductive plan and the electrically conductive patterns are electrically connected to each other through a conductive via that passes through the resin layer.

3. The semiconductor package of claim 1, wherein the conductive plan is further extended to the inside of the cavity at a predetermined length.

4. The semiconductor package of claim 1, wherein an insulating dam of a predetermined thickness is formed at a bottom surface of the substrate, which is located at the periphery of the cavity of the substrate.

5. The semiconductor package of claim 1, wherein the adhesive layer is thermally conductive.

6. The semiconductor package of claim 1, wherein the adhesive layer of a predetermined thickness prevents damage to the semiconductor die during a laser marking process.

7. The semiconductor package of claim 1, wherein the conductive plan shields electromagnetic waves.

8. The semiconductor package of claim 1, wherein a protective layer is coated on surfaces of the conductive plan and the electrically conductive patterns of the substrate.

9. The semiconductor package of claim 8, wherein a top surface of the adhesive layer is flushed with a top surface of the protective layer, which is formed at a top surface of the substrate.

10. A method of manufacturing a semiconductor package, comprising:
    providing a substrate comprising a resin layer of an approximate planar plate, a cavity passing through the resin layer vertically at a center area thereof, a plurality of electrically conductive patterns formed at a bottom surface of the resin layer, and a conductive plan;
    bonding a cover lay tape to the substrate such that the cover lay tape closes up the cavity of the substrate;
    forming an adhesive layer on a top surface of the cover lay tape by applying an epoxy, wherein a top surface of the adhesive layer is exposed;
    attaching a semiconductor die on the adhesive layer;
    separating the cover lay tape from the substrate;
    bonding bond pads of the semiconductor die to electrically conductive patterns of the substrate by a plurality of conductive wires; and encapsulating the semiconductor die, the conductive wires and the cavity by an encapsulant.

11. The method of claim 10, wherein a protective layer is coated on surfaces of the conductive plan and the electrically conductive patterns of the substrate in the substrate providing step.

12. The method of claim 10, wherein the conductive plan and the electrically conductive patterns are electrically connected to each other through a conductive via that passes through the resin layer, in the substrate providing step.

13. The method of claim 10, wherein the conductive plan is extended to the inside of the cavity at a predetermined length in the substrate providing step.

14. The method of claim 10, wherein an insulating dam of a predetermined thickness is further formed at a bottom surface of the substrate, which is located at the periphery of the cavity of the substrate, in the substrate providing step.

15. A semiconductor package comprising:
  a substrate comprising a resin layer of an approximate planar plate, a cavity passing through the resin layer vertically at a center area thereof, a plurality of electrically conductive patterns formed at a bottom surface of the resin layer, and means for shielding electromagnetic waves;
  an adhesive layer formed at an upper part of an inside of the cavity and having an exposed top surface;
  a semiconductor die positioned inside the cavity of the substrate and having a plurality of bond pads, a bottom surface of the adhesive layer being bonded to the semiconductor die;
  a plurality of conductive wires for electrically connecting the bond pads of the semiconductor die to the electrically conductive patterns; and
  an encapsulant for covering the semiconductor die formed at the lower part of the adhesive layer, the conductive wires and the cavity.

16. The semiconductor package of claim 15, wherein a protective layer is coated on surfaces of the conductive plan and the electrically conductive patterns of the substrate.

17. The semiconductor package of claim 15, wherein the conductive plan and the electrically conductive patterns are electrically connected to each other through a conductive via that passes through the resin layer.

18. The semiconductor package of claim 15, wherein the means extended to the inside of the cavity at a predetermined length.

19. The semiconductor package of claim 15, further comprising means formed at a bottom surface of the substrate, which is located at the periphery of the cavity of the substrate for preventing the conductive patterns from contamination.

20. The semiconductor package of claim 15, wherein the adhesive layer is thermally conductive.

* * * * *